United States Patent [19]

Duigon et al.

[11] 3,990,099
[45] Nov. 2, 1976

[54] PLANAR TRAPATT DIODE
[75] Inventors: Ferdinand Carl Duigon, East Brunswick; Shing-gong Liu, Princeton, both of N.J.
[73] Assignee: RCA Corporation, New York, N.Y.
[22] Filed: Dec. 5, 1974
[21] Appl. No.: 529,909

[52] U.S. Cl. .................................... 357/13; 357/51; 357/55; 357/59; 357/90
[51] Int. Cl.² .................. H01L 29/90; H01L 27/02; H01L 29/04; H01L 29/06
[58] Field of Search .................. 357/13, 51, 55, 59, 357/90

[56] References Cited
UNITED STATES PATENTS

| | | | |
|---|---|---|---|
| 3,600,649 | 8/1971 | Liu et al. | 357/13 |
| 3,663,874 | 5/1972 | Fukukawa et al. | 357/13 |
| 3,743,967 | 7/1973 | Fitzsimmons et al. | 357/13 |
| 3,909,119 | 9/1975 | Wolley | 357/13 |

*Primary Examiner*—Edward J. Wojciechowicz
*Attorney, Agent, or Firm*—H. Christoffersen; R. P. Williams; W. L. Muckelroy

[57] ABSTRACT

A planar TRAPATT diode includes a substrate selected from an area of a silicon wafer, a diffused region within the area, a mask of an insulating layer of $SiO_2$, and a conductive layer of polycrystalline silicon. The silicon wafer includes a doped P region adjacent to the surface thereof and a heavily doped $P^+$ region adjacent to the P region. The TRAPATT junction is a selected area below the surface at the interface between the diffused region, which is $N^+$, and the P region. The polycrystalline silicon layer is the dopant source for the $N^+$ diffused region and contacts the wafer in the selected area.

8 Claims, 3 Drawing Figures

PLANAR TRAPATT DIODE

The present invention relates to a TRAPATT diode and more specifically to a TRAPATT diode having an entirely planar configuration as opposed to a configuration which may be referred to as a mesa.

A TRAPATT diode generally means a silicon PN junction diode that can produce a peak power of hundreds of watts in microwave frequencies by means of avalanche operation.

The TRAPATT diode technology as it has heretofore developed is based industry-wide on mesa-type structures. While good results have been obtained with mesa TRAPATT diodes, further major improvements in the reliability and performance of TRAPATT diodes can be obtained with a structure of the planar-type. Accordingly, it would be most advantageous in the field of microwave TRAPATT diodes to have such a device manufactured in the planar structure.

The detailed aspects of the invention as well as the operation thereof will be more fully explained and can be followed by reference to the appended drawings and detailed description of the performance and the embodiment wherein.

Figure 1:
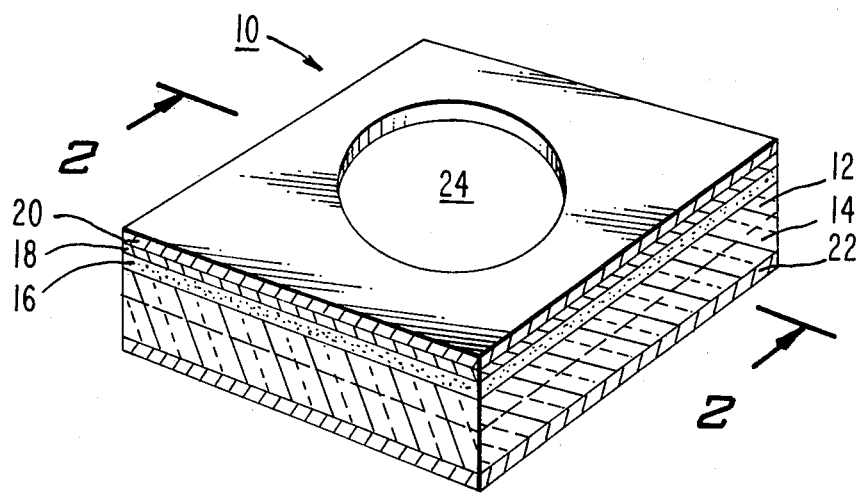
FIG. 1 is an elevated sectional view of the planar TRAPATT diode.

Referring to FIG. 1, a structure illustrating the planar TRAPATT diode of the present invention is designated as 10. In the preferred embodiment, planar TRAPATT diode 10 is a body of single crystalline semiconductor material, usually silicon, with three distinct conductivity regions. Regions 12 and 14 are, respectively, a moderately doped region of, for example, silicon having P type conductivity and a heavily doped region of, for example, silicon having $P^+$ type conductivity. A layer 16 of silicon dioxide, $SiO_2$, is located on top of the region 12. The layer 16 has an aperture therein. The aperture exposes a selected area of the silicon of region 12 for diffusion of impurities thereinto. The impurities are diffused from a layer 18 of, for example, polycrystalline silicon. The layer 18 is referred to in the doping profile Q of FIG. 3 as region A. The doping profile Q is a plot of the doping density N versus the distance X (see FIG. 2) as measured from the top of the layer 18 of polycrystalline silicon starting from within the depressed area 24. The density, N, of the donor atoms is approximately $4 \times 10^{20} cm^{-3}$ and this density is maintained from approximately $X = 0$ to somewhere between $X = 1.6$ micrometers and $X = 2.4$ micrometers. In regard to the doping density, N, there is a graded transition between the polycrystalline layer 18 and the region 26 of FIG. 2 (referred to as region B in FIG. 3) underneath.

Figure 2:
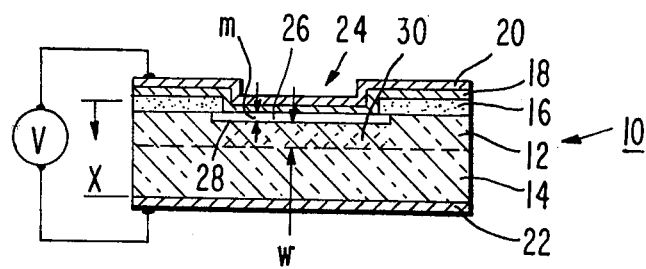
FIG. 2 is a cross-section showing the structure of the planar TRAPATT diode of FIG. 1 along the line 2—2.

The polycrystalline silicon is degeneratively doped. In the present embodiment, it is doped $N^{++}$ with arsenic. Referring to FIG. 1, contacts 20 and 22 are located on the top and the bottom surfaces, respectively, of the diode 10. A depressed area 24 appears in the center of the diode 10 because of the aperture in the layer 16. The layers 18 and 20 conform to the shape exhibited by the layer 16 and the aperture therein. As shown in FIG. 2, the region 26 is located beneath the depressed area 24 and actually extends beyond and underneath the aperture in the layer 16. The region 26 is single crystal silicon heavily doped $N^+$ with arsenic atoms. Region 26 was, prior to its present conductivity, a part of the region 12 and differs therefrom presently only in conductivity and degree of doping. This is observed in FIG. 3, where the region B plus the region C is the original region 12 of FIG. 2 prior to diffusion of the region 26. The forementioned difference in degree of doping is characterized in the doping profile at $X = 3.0$ micrometers by a sharp change in N. Between $X = 3.1$ micrometers and $X = 3.2$ micrometers the density N changes from $2.0 \times 10^{15} cm^{-3}$ to $1.9 \times 10^{14} cm^{-3}$ to $4.0 \times 10^{14} cm^{-3}$. Thus, in the span of a tenth of a micrometer the density decreases by an order of magnitude and then increases 100%. Although in reality a diffused junction of the type herein referred to is never sharply defined and, for most practical purposes, is a theoretical fiction, for the purposes of this description this span is referred to as a TRAPATT diode junction. It is marked in FIG. 2 as 28 and is the interface between the region 12 and the region 26. More precisely, the junction 28 is a PN junction exhibited as the interface between the heavily doped $N^+$ region 26 and the moderately doped P region 12. However, the location of the junction 28 with respect to its surrounding structures, its definition in accordance with the geometry of the aperture in layer 16, and its anomalous TRAPATT operation are the more important and technologically significant aspects of the junction 28. When the device is properly manufactured, the various regions 12, 14, and 26 and the layer 16 of polycrystalline silicon collectively exhibit a doping profile similar to the one in FIG. 3.

Figure 3:
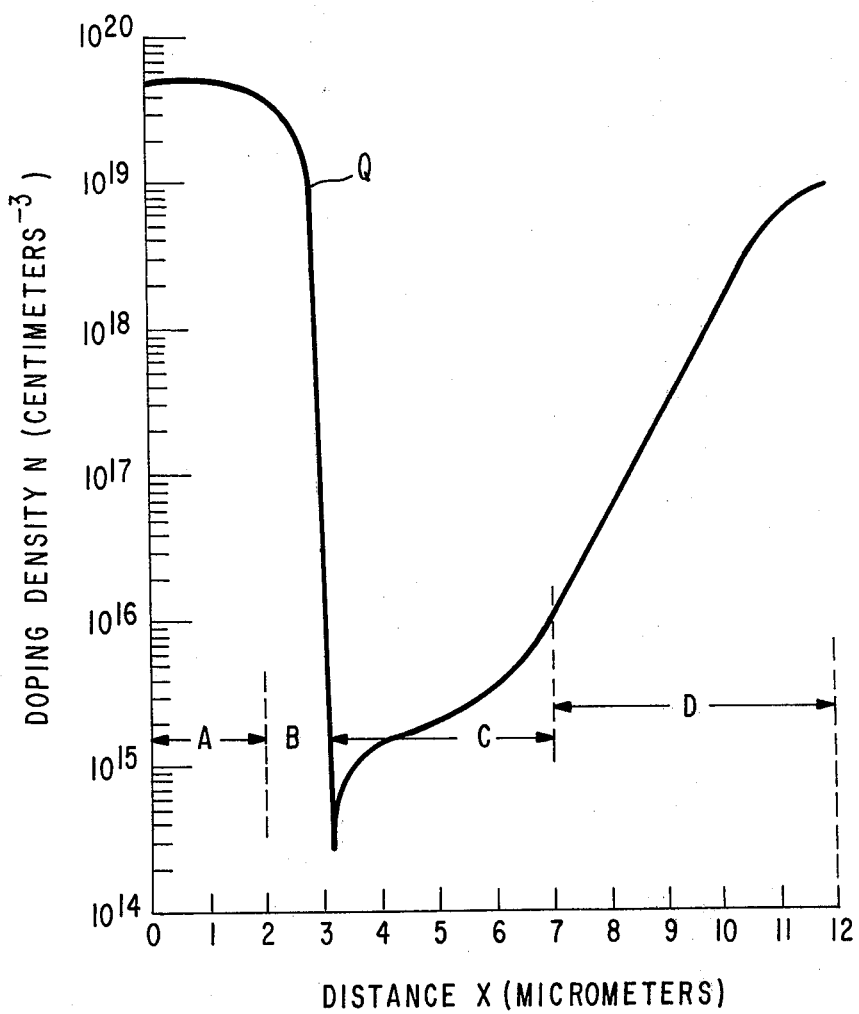
FIG. 3 is a plot of the doping density N of the TRAPATT diode shown in FIG. 2 in the X direction.

The device 10 is made with the profile of FIG. 3 by first epitaxially growing a region 12 of single crystal silicon on a region 14. The region 14 is a wafer of bulk $P^+$ doped silicon 225 to 250 micrometers thick. The epitaxial region 12 is grown by standard methods to a thickness of 10 to 12 micrometers. The layer 16 of silicon dioxide is thermally grown in a furnace by placement of the previously defined structure of regions 12 and 14 in an oxygen rich furnace maintained at a temperature of 1000° C for 15 to 17 hours. The final thickness of the layer 16 of $SiO_2$ is about 2.0 micrometers.

A graded interface between the regions 12 and 14 of FIG. 2 is required. The grading of the interface is exhibited in FIG. 3 between the analogous regions C and D. This is partially accomplished during the growth of the layer 16 of $SiO_2$. The extended formation time of 15 to 17 hours for the layer 16 at the aforementioned temperature causes diffusion of some of the impurity atoms within the region 14 into the lowermost portions of the region 12. Thus, the interface between the two regions may be said to move upward during this period. This upward movement of the interface reduces the width W (FIG. 2) of the space between PN junction 28 and the region 14. This space is designated in FIG. 2 as a region 30 and in FIG. 3 as the analogous region C. The region 30 is bounded by the regions 26 and 14 and is limited to the volumetric expanse of region 12 beneath region 26. The region 30 is sometimes referred to in this art as the depletion region and for this particular device, W may vary from 3.6 to 4.2 micrometers. For the doping profile Q in FIG. 3, W is 4.0 micrometers and the doping density N varies as shown in the region C. W is determined and selected in accordance with a formula (introduced below in the description of the operation of the device) to achieve a particular operating frequency.

The $SiO_2$ layer 16 in FIG. 2 is made into a diffusion mask by etching an aperture therein. The aperture is formed by use of the standard "photoresist mask and etch" technique whereby the $SiO_2$ is first coated with photoresist and exposed with irradiation in accordance with a photographically produced and patterned film. The photoresist, when developed, forms a coating resistant to a buffered hydrofluoric acid (HF) etchant. The etchant forms the aperture in the layer 16. The photoresist is then removed.

The polycrystalline silicon layer 18 in FIG. 2 (region A of FIG. 3) is epitaxially grown using the silane reaction technique. A thickness of 2.0 micrometers is preferred. The polycrystalline silicon is doped with arsenic because of its slow diffusion rate (between $1 \times 10^{-13} cm^2/sec$ and $5 \times 10^{-13} cm^2/sec$) and its N type conductivity. The slow diffusion rate for the arsenic provides additional time at the elevated temperature to further grade and move the interface between regions 12 and 14 (region C and D in FIG. 3). The grading of the interface increases significantly the power handling capabilities of the planar TRAPATT diode.

Referring to FIG. 2, contact diffusion of arsenic atoms from the layer 18 forms region 26 out of region 12. A diffusion time of approximately 2 hours at 1200° C produces the region 26. A thickness m of approximately 1 micrometer (in the X direction) is required for region 26. These diffusion parameters for region 26 in combination with the diffusion rate of the arsenic and in concatenation with the previous thermal growing steps for the layer 16 of $SiO_2$ tailor the width W of the depletion region 30 to the correct value of from 3.6 to 4.2 micrometers. The final product is a TRAPATT diode having a planar diffused junction with a layer of $SiO_2$ protecting the edges thereof and a degeneratively doped epitaxial layer of polycrystalline silicon thereon. Moreover, this TRAPATT diode has increased power handling capability because of an electric field buffer produced by the 3 to 6 micrometer grading of the P $P^+$ interface of regions 12 and 14.

So that an operating signal may be applied to the device either a chromium-gold or a chromium-platinum-gold layered coating is appositioned on the top and on the bottom of the device. The top of the device is bounded by the layer 18. The bottom of the device is a surface of the region 14 disposed parallel to the junction 28. In the chromium-gold coating, the chromium is typically 0.04 to 0.05 micrometers thick. The gold is typically 0.5 to 1.0 micrometers thick.

The metal coatings 20 and 22 of either the chromium-gold system or the chromium-platinum-gold system are deposited by sputtering or other equivalent means commonly used in this art.

As shown in FIG. 2 inbetween the coating 18 and beyond the underlapping edges of the region 26 is located a material composed of the portion of the $SiO_2$ layer 16 which is adjacent to both the surface of layer 18 and region 12. This portion of layer 16 acts as the dielectric of a capacitor having as plates the adjoining layer 18 and the adjoining region 30. This structurally inherent capacitor acts as a shunt capacitor and charge storage device for the RF currents created during operation of the diode. This enhances the field in the depletion region 30 and results in a higher power output during operation.

For TRAPATT operation a specific relationship between doping density and diffusion depth is necessary in the region 30. The depth W of the region 30, measured in the X direction, is determined by the equation:

$$W = \frac{0.07 V_s}{f_o}, \quad (1)$$

where $f_o$ is the operating frequency of the diode 10 and $V_s$ is the saturation velocity of the region 30. The average density of impurity atoms N, for region 30 is determined by the equation:

$$N = \frac{\epsilon E_B}{Wq}, \quad (2)$$

where $\epsilon$ is the dielectric constant, $q$ is the electronic charge, and $E_B$ is the breakdown electric field.

For the TRAPATT diode of the invention to operate at a frequency of, for example, 2 GHz, region 30 must have an electron path width, W, of approximately 3.5 micrometers and an average doping density, N, of $2.6 \times 10^{15}/cm^3$, as indicated for the analogous region C of FIG. 3.

The active area of the diode, i.e., the plan cross-sectional area of region 30, can be varied from approximately $44 \times 10^3$ micrometers$^2$ to $440 \times 10^3$ micrometers$^2$ without impedance matching problems at L-band. The impedance at the upper area limit is approximately 2 ohms in this band. The impedance increases as the active area is lowered. Below 2 ohms it becomes difficult to match the diode into a circuit for operation at the L-band frequencies.

The layer 18 of doped polycrystalline silicon has a much higher carrier concentration than region 26 and accordingly layer 18 functions, subsequent to diffusion, primarily as an electric contact and as an interconnecting means to region 30 through region 26. The average carrier concentration, N, for the layer 18 is of the order of $10^{19}/cm^3$.

As stated above, the interface between regions 12 and 14 is actually graded. By this it is meant that there is no sharp difference in the doping density N on either side. This is a specifically desired feature which is designed into the device. Referring briefly to FIG. 3, it is observed that from X = 6 to X = 11 the doping density changes from approximately $5 \times 10^{15}/cm^3$ to $8 \times 10^{18}/cm^3$. The change in the slope of Q is minimal over this range with respect to other parts of Q and thus the region is said to be graded.

To further clarify this aspect of the device, in FIG. 3, A represents the polycrystalline silicon region 18 of FIG. 2, B represents the diffused region 26 of FIG. 2, C represents the depletion region 30, of FIG. 2 and D represents region 14 of FIG. 2, the portion of region 16 immediately below the depletion region 30. Between B and C there is an abrupt change in the slope of the profile Q. Thus, the interface between the regions 26 and 30 is not graded. There is an abrupt junction shown in FIG. 2 as 28.

As forementioned, the graded carrier concentration about the interface between the regions 12 and 14 increases the power handling capability of the device. Ordinarily, a sufficiently high RF field impinging upon an abrupt junction at the P $P^+$ interface would enable the current resulting therefrom to burn a leakage path in the P+ region 14. Once this occurs the device cannot build up a sufficient carrier density in the region 30 for TRAPATT operation. Shunt capacitance enables a higher operating field. The shunt capacitor stores charges from the region 12 and thus assists the charge buildup in the region 30 necessary for anomalous oper- The diode 10 was tested as a TRAPATT oscillator in an L-band microstrip circuit. Results of these tests are summarized in the table below wherein $V_B$ is the breakdown voltage, V is the operating voltage, I is the bias current, $f_o$ is the operating frequency, and P is the power output:

TABLE I

| Wafer | Type | $V_B$ (Volts) | V (Volts) | Diode Dia. (cm) | $f_o$ (GHz) | I (Amps) | P (Watts) |
|---|---|---|---|---|---|---|---|
| LD1 | N+/P/P+ | 110 | 85 | 0.046 | 1.40 | 10.0 | 200 |
| LD2 | N+/P/P+ | 120 | 75 | 0.046 | 1.40 | 7.0 | 135 | ation (discussed below).

By controlling the thermal growth of the layer 16 of SiO₂ into the layer 12 and the upward diffusion of the impurities in the layer 14 into the layer 12 at the time of the N+ diffusion the depth of the depletion region 30 (region C in FIG. 3) is reduced to approximately 4 micrometers. This is a suitable depth for TRAPATT oscillation in the upper L-band frequency range.

Figure 4:
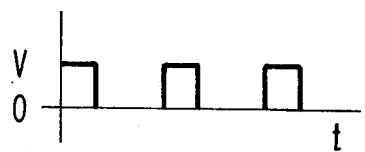
FIG. 4 is a graphic illustration of an operating bias voltage signal for the diode.

For TRAPATT diode operation of the junction 28, a pulsed reverse bias, such as that graphically illustrated in FIG. 4, is placed across the junction 28 in FIG. 2 by application of the selected voltage V to the metal contacts 20 and 22. An electric field E is created by the reverse bias. The electric field, in turn, acts on the depletion region 30 within the epitaxial layer 12. If the magnitude of the bias voltage is increased beyond the punch-through voltage (i.e., the voltage at which carriers from the region 26 traverse the junction 28) to a value slightly greater than the junction breakdown voltage, $E_B$, carriers are generated in the depletion region 30 (the active region) by impact ionization. Ionization first occurs at the point of maximum electric field within the depletion region 30 (region C of FIG. 3). This point is slightly beyond the junction 28 within the depletion region 30 at X > 3.0. More carriers are created when the ionized carriers collide with other atoms in the region 30. The electric field sweeps from the junction 28 through the depletion region 30 and impinges upon the region 14. Analogously, the electric field sweeps as a wave front across the region C of FIG. 3. The wave front moves with a specific wave velocity. When the velocity of the wave front is greater than the saturation velocity, $V_s$, of the carriers generated in the depletion region, a high density of holes and electrons is generated and left as a surplus in the wake of the wavefront. In the depletion region the electrons drift in the same direction as the wave, while holes drift in the opposite direction, i.e., away from the region 14. The electron density in the wake of the wavefront is higher than the density of the holes. Thus, a mobile, electron rich, region is created behind the wavefront and eventually reduces the magnitude of the electric field. Therefore, when a sufficient number of these electrons are generated to overcome the doping density of the depletion region C of FIG. 3 (region 30 of FIG. 2), the rate of change of the magnitude of the electric field reverses (begins to decrease) and the field reaches a very low value. The low field, the electrons, and the holes are all substantially slowed in velocity. This causes the formation of a dense plasma. This operation of the region 30 of FIG. 2 having the doping profile of region C in FIG. 3 is referred to as the TRAPATT mode of operation.

The conductivity types of regions 12 and 14 in the preferred embodiment may be reversed to N type and the region 26 doped with polycrystalline silicon degeneratively doped with boron in order to make the diffused region 26 P+ and the diode structure P+/N/N+.

The planar diode of the invention, as described herein, unlike the mesa diode of the prior art has no exposed junctions. Furthermore, the problem of metal migration to the PN junction is alleviated. Polycrystalline silicon is used as a source for diffusing the PN junction region. The retainment of the polycrystalline silicon as a permanent part of the TRAPATT diode structure impedes metal migration to the PN junction. For these reasons alone, the planar TRAPATT diodes of the invention have an increased reliability over the diodes of the prior art.

A built-in capacitor is inherent in the diode structure and in a diode circuit it increases power handling capability. The built-in capacitor arises from the use of a mask of an oxide of silicon to define the area and shape of the diode junction. The insulating property of the oxide of silicon provides the dielectric for a capacitor adjoining the periphery of the diode junction.

The use of the oxide of silicon to define the planar junctions also provides greater control over the size and shape of these diodes. This, in turn, makes possible higher packing densities and greater size selections for the diodes and the convenient integration of other components and devices producible using SOS technology. The junctions of mesa TRAPATT diodes are defined by etching. Thus, the diode junction definition is controlled by limiting etchant contact with the silicon. In contrast, the new planar TRAPATT diodes of the invention have diffused junctions which are defined by the geometry of the diffusion mask.

Polycrystalline silicon on top of the layer 16 of silicon dioxide, SiO₂, is used to connect the device 10 into an integrated circuit having other components therein. Thus, it is possible to integrate the TRAPATT diode 10 with other devices such as those which utilize polycrystalline silicon gates.

What is claimed is:
1. A planar TRAPATT diode capable of generating RF power at microwave frequencies comprising:
   a single crystal semiconductor substrate comprising a moderately doped first region of a first conductivity type and a heavily doped second region of the first conductivity type adjacent to the first region;
   a layer of a dielectric having at least one aperture therein disposed on the first region;
   a diffusing layer having impurities of an opposite conductivity type disposed on the dielectric and disposed inside the aperture in the dielectric sealing said aperture;

a heavily doped third region of the substrate, having an opposite conductivity type, located in the first region at the surface thereof and surrounded thereby, the heavily doped third region of the opposite conductivity type being located adjacent to the aperture in the dielectric;

a first contact disposed on the diffusing layer, and;

a second contact disposed on a surface of the second region, the diffusing layer and the third, first and second regions collectively having a doping density profile substantially as exhibited in FIG. 3 for a corresponding layer A and corresponding regions B, C, and D therein, respectively.

2. The TRAPATT diode of claim 1 wherein the dielectric is an oxide of silicon.

3. The TRAPATT diode of claim 2 wherein the layer is a degeneratively doped layer of polycrystalline silicon.

4. The TRAPATT diode of claim 3 wherein the layer is epitaxially grown polycrystalline silicon.

5. The TRAPATT diode of claim 4 wherein the first region is comprised of a layer of epitaxial silicon.

6. The TRAPATT diode of claim 5 wherein the substrate is of P type conductivity.

7. The TRAPATT diode of claim 5 wherein the substrate is of N type conductivity.

8. An integrated circuit for generating RF power at microwave frequencies comprising:

a single crystal semiconductor wafer;

at least one planar TRAPATT diode embedded in the wafer, adjacent a surface thereof, the diode having a layer of an apertured dielectric adjacent a heavily doped third region and a connector connected to said third region comprised of a layer of an epitaxially grown polycrystalline semiconductor adjacent the dielectric inside the aperture sealing said diode;

a capacitor surrounding the diode having a dielectric comprised of the apertured dielectric, the capacitor being connected in shunt relationship to each diode by said connector adjacent one surface of the dielectric and by a moderately doped first region adjacent another surface of the dielectric, each TRAPATT diode comprising;

the single crystal semiconductor wafer comprised of the first region of a first conductivity type and a heavily doped second region of the first conductivity type;

the third region having an opposite second conductivity type and located in the first region at the surface thereof and surrounded thereby;

a first contact disposed on the epitaxial layer, and;

a second contact disposed on the surface of the second region, the epitaxial layer and the third, first and second regions having a doping profile corresponding substantially to the doping profile shown in FIG. 3 for the layer A and the regions B, C and D, respectively.

* * * * *